United States Patent [19]

Kung

[11] Patent Number: 5,045,800
[45] Date of Patent: Sep. 3, 1991

[54] PULSE WIDTH MODULATOR CONTROL CIRCUIT

[75] Inventor: David Kung, San Carlos, Calif.
[73] Assignee: Power Integrations, Inc., Mountain View, Calif.
[21] Appl. No.: 498,829
[22] Filed: Mar. 23, 1990
[51] Int. Cl.$^5$ .......................... H03K 5/01; H03K 5/153
[52] U.S. Cl. .......................... 328/59; 307/261; 307/265; 307/268; 307/360; 328/62
[58] Field of Search ............... 307/261, 265, 268, 228, 307/360; 328/59, 62

[56] References Cited

U.S. PATENT DOCUMENTS 3,571,501 3/1971 Yamamoto .......................... 307/261
4,587,439 5/1986 Van Roessel ...................... 307/261

Primary Examiner—John Zazworsky
Attorney, Agent, or Firm—Thomas E. Schatzel

[57] ABSTRACT

A circuit generates control signals used in pulse width modulation. A square wave signal generator generates a square wave signal based on the value of a sawtooth signal. The sawtooth signal has a maximum voltage level and a minimum voltage level. The voltage level of the sawtooth signal is compared with a first voltage slightly above the minimum voltage level. When voltage of the sawtooth signal is increasing and reaches the first voltage, a rising edge of the square wave is generated. The voltage level of the sawtooth signal is also compared with a second voltage slightly below the maximum voltage level. When voltage of the sawtooth signal is increasing and reaches the second voltage, a falling edge of the square wave signal is generated.

12 Claims, 2 Drawing Sheets

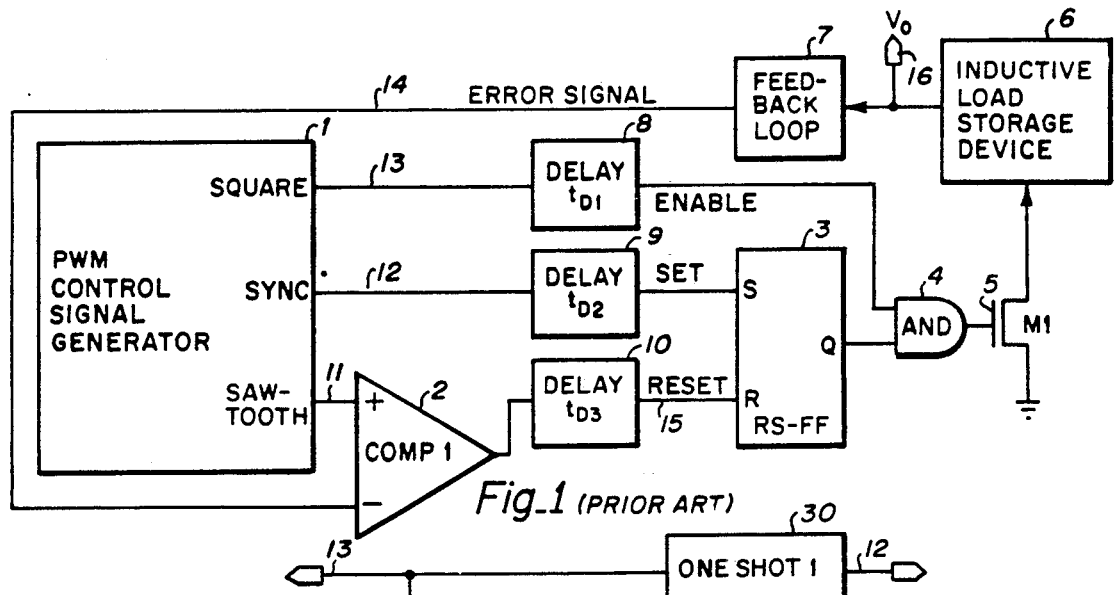
Fig_1 (PRIOR ART)
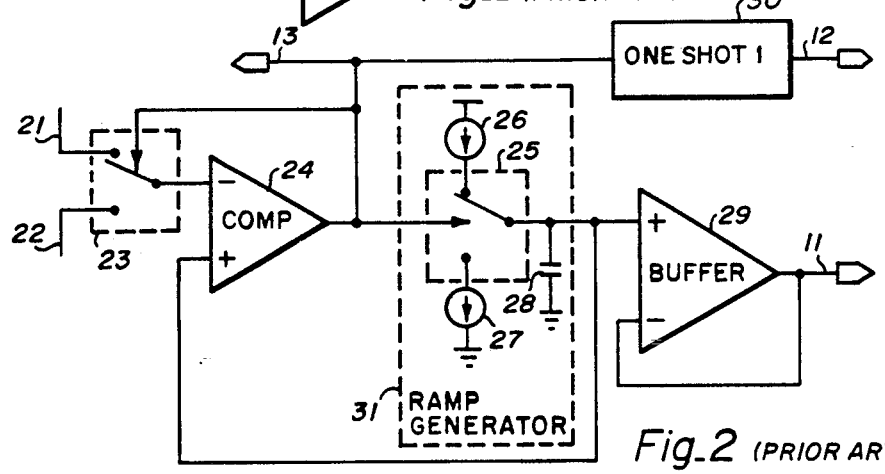
Fig_2 (PRIOR ART)
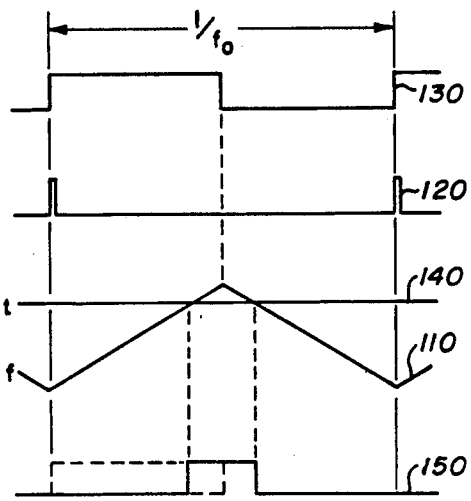
Fig_3

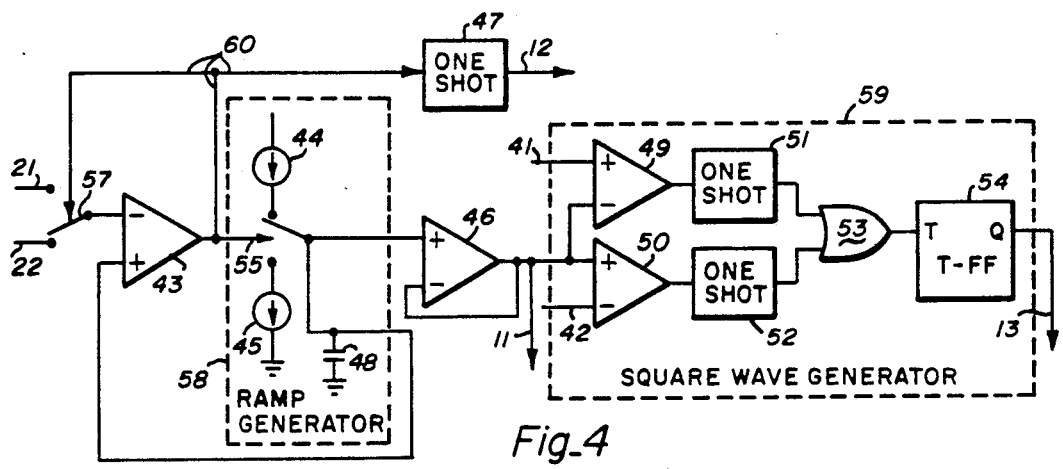
Fig_4
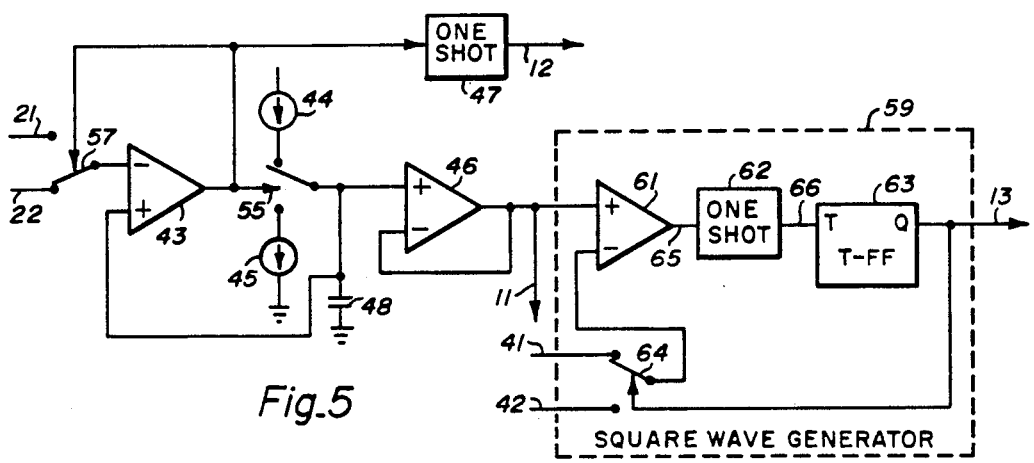
Fig_5
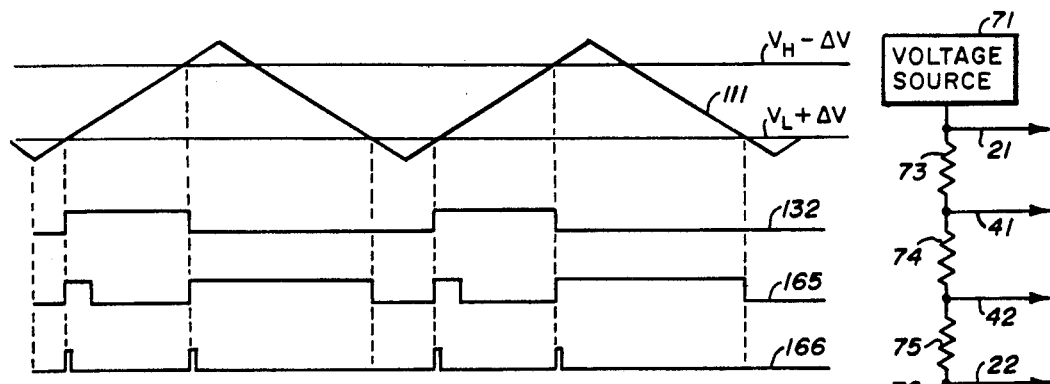
Fig_6
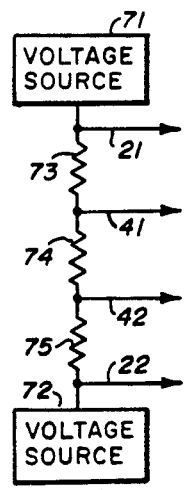
Fig_7

PULSE WIDTH MODULATOR CONTROL CIRCUIT

BACKGROUND

The present invention concerns generating control signals for use in pulse width modulation.

Pulse width modulated signals are useful in many applications. A pulse width modulated signal may be generated, for example, by comparing a sawtooth signal and a feedback signal. The duty cycle of the resultant pulse modulated signal may vary, for example, based on the percentage of time the voltage of the sawtooth signal is greater than the voltage of the feedback signal.

In some prior art systems, a pulse width modulation (PWM) control circuit system requires three control signals. In such a system, control signals include, for example, a sawtooth signal, a synchronization pulse, and a square wave. As more completely illustrated in the Description of the Prior art below, it is often the case that control signals are slightly out of synchronization because of propagation delays inherent in the circuitry which generates the control signals. Because the control signals are out of synchronization, delay must be added within the PWM control circuit system to compensate. However, it is difficult to precisely determine and supply the correct amount of delay. Therefore, a PWM control circuit system may become non-linear or unstable at the extremes of its operating range. It is desirable, therefore, to develop a control signal generator which generates control signals in such a way that an incorporating PWM control circuit system will maintain linearity even at the outer limits of its operating range.

SUMMARY OF THE INVENTION

In accordance with the preferred embodiment of the present invention, a circuit is presented which generates control signals used in pulse width modulation. A square wave signal generator generates a square wave signal based on the value of a sawtooth signal. The sawtooth signal has a maximum voltage level and a minimum voltage level. The voltage level of the sawtooth signal is compared with a first voltage slightly above the minimum voltage level. When voltage of the sawtooth signal is increasing and reaches the first voltage, a rising edge of the square wave is generated. The voltage level of the sawtooth signal is also compared with a second voltage slightly below the maximum voltage level. When voltage of the sawtooth signal is increasing and reaches the second voltage, a falling edge of the square wave signal is generated.

In the present invention the square wave signal generated has a duty cycle of slightly less than 50%. This slightly reduces the operating range of a PWM control circuit system incorporating circuits designed according to the present invention. However, the present invention allows the PWM control circuit system to operate linearly across its entire operating range. This is a significant improvement over the prior art.

BRIEF DESCRIPTION OF THE DRAWINGS

FIG. 1 shows a prior art PWM control circuit system.

FIG. 2 shows a prior art implementation of a control signal generator within the PWM control circuit system shown in FIG. 1.

FIG. 3 shows timing diagrams for signals within the PWM control circuit system shown in FIG. 1.

FIG. 4 shows an implementation of a control signal generator in accordance with a preferred embodiment of the present invention.

FIG. 5 shows an implementation of a control signal generator in accordance with an alternate preferred embodiment of the present invention.

FIG. 6 shows timing diagrams for signals within the control signal generator shown in FIG. 5.

FIG. 7 illustrates circuit means for generating incremental voltages for the generator of FIG. 4.

DESCRIPTION OF THE PRIOR ART

In FIG. 1 is shown a prior art PWM control circuit system. A control signal generator 1 generates a square wave signal 130 (shown in FIG. 3) on a line 13, a synchronization signal 120 (shown in FIG. 3) on a line 12 and a sawtooth signal 110 (shown in FIG. 3) on a line 11.

A comparator 2 compares sawtooth signal 110 on line 11 with a feedback (error) signal 140 on a line 14 to generate a reset signal 150 on a line 15. Reset signal 150 is connected to an R input of an RS flip-flop 3. The synchronization signal 120 is connected to an S input of RS flip-flop 3. A logic gate 4 is used to perform a logical AND on the output from RS flip-flop and the square wave signal 130 on line 13.

The output of logic gate 4 controls a transistor switch 5 coupled to ground. An inductive load storage device 6 receives from transistor switch 5 a pulse width modulated signal having a duty cycle which is less than or equal to 50%. Inductive load storage device 6 generates an output voltage $V_o$ on a line 16. A feedback loop 7, based on the value of $V_o$, generates feedback signal 140 placed on line 14. A delay 8, a delay 9 and a delay 10 are introduced to compensate for propagation delay within components of the PWM control circuit system.

FIG. 3 shows idealized timing diagrams for square wave signal 130, synchronization signal 120 and sawtooth signal 100. These timing diagrams assume there is no propagation delay within components of the PWM control circuit system.

FIG. 2 shows a prior art implementation of control signal generator 1. A switch 23 selects a voltage $V_H$ on a line 21 or a voltage $V_L$ on a line 22 to connect to a negative input of a comparator 24. Comparator 24 generates square wave signal 130 on line 13. A one shot circuit 30 receives as input square wave signal 130 on line 13 and produces synchronization signal 120 on line 12. A ramp generator 31 consists of a switch 25, a current source 26, a current source 27 and a capacitor 28 connected as shown. Square wave 130 is used to control the oscillation frequency of switch 25. The output of ramp generator 31 is buffered by a buffer 29 to produce sawtooth signal 110 on line 11.

Propagation delays within the disclosed prior art implementation of control signal generator 1 result in the PWM control circuit system losing linearity as the duty cycle of the generated pulse width modulated signal approaches zero or maximum (50%).

DESCRIPTION OF THE PREFERRED EMBODIMENT

In FIG. 4 a design of control signal generator 1 is shown in which linearity is maintained even in ranges where the duty cycle of the PWM control circuit system approaches zero or maximum (50). A switch 57 selects voltage $V_H$ on line 21 or voltage $V_L$ on a line 22 to connect to a negative input of a comparator 43. Comparator 43 generates a signal on a line 60. A one shot circuit 47 receives as input the signal on line 60 and produces synchronization signal 121 on line 12. A ramp generator 58 consists of a switch 55, a current source 44, a current source 45 and a capacitor 48 connected as shown. The signal on line 60 is used to control the oscillation frequency of switch 55. The output of ramp generator 58 is buffered by a buffer 46 to produce sawtooth signal 111 on line 11.

Sawtooth signal 111 is also used as an input to square wave generator 59. Square wave generator 59 generates a square wave 131 on line 13. Square wave generator 59 includes a comparator 49, a comparator 50, a one shot circuit 51, a one shot circuit 52, a logical OR gate 53 and a toggle flip-flop 54 connected as shown. Comparator 49 compares sawtooth signal 111 with a signal $V_H - \Delta V$ on a line 41. Similarly, comparator 50 compares sawtooth signal 111 with a signal $V_L + \Delta V$ on a line 42.

$\Delta V$ is chosen so that the duty cycle of square wave 131 is slightly less than 50%. For example, when $V_L$ equals 1.0 volts and $V_H$ equals 2.5 volts then $\Delta V$ may be set to equal 0.10 volts. FIG. 7 shows an example of how voltage signals $V_L$, $V_L + \Delta V$, $V_H$ and $V_H - \Delta V$ may be generated. A voltage source 71 produces voltage signal $V_H$ on line 21. A voltage source 72 produces voltage signal $V_L$ on line 22. A voltage divider consisting of a resistor 73, a resistor 74 and a resistor 75 produces signal $V_H - \Delta V$ on line 41 and produces signal $V_L + \Delta V$ on line 42.

In FIG. 5 an alternate embodiment of square wave generator 59 is shown. Square wave generator generates a square wave 132 on line 13. Square wave generator 59 is shown to include a comparator 61, a one shot 62, a toggle flip-flop 63 and a switch 64, connected as shown. Switch 64 selects voltage signal $V_H - \Delta V$ on line 41 or voltage signal $V_L + \Delta V$ on line 42 to connect to a negative input of comparator 61. Sawtooth signal 111 is connected to a positive input of comparator 61.

FIG. 6 shows timing diagrams for square wave generator 59 as embodied in FIG. 5. FIG. 6 shows how square wave 132 on line 13, a signal 165 on a line 65, and a signal 166 on a line 66 oscillate with respect to sawtooth signal 111 on line 11.

Although the present invention has been described in terms of the presently preferred embodiment, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

I claim:

1. A circuit which generates control signals used in pulse width modulation, the control signals including a square wave signal and a sawtooth signal, the sawtooth signal oscillating between a maximum voltage level and a minimum voltage level, the circuit comprising:

sawtooth signal generating means, for generating the sawtooth signal; and, square wave signal generating means, coupled to the sawtooth signal generating means, for receiving the sawtooth signal, for comparing the voltage level of the sawtooth signal with a first voltage slightly above the minimum voltage level and with a second voltage slightly below the maximum voltage level, and for generating a square wave with a rising edge that occurs only when voltage of the sawtooth signal is increasing and reaches the first voltage and with a falling edge that occurs only when voltage of the sawtooth signal is increasing and reaches the second voltage.

2. A circuit which generates control signal used in pulse width modulation, the control signals including a square wave signal and a sawtooth signal, the sawtooth signal having a maximum voltage level and a minimum voltage level, the circuit comprising:

sawtooth signal generating means, for generating the sawtooth signal; and square wave signal generating means, coupled to the sawtooth signal generating means, for receiving the sawtooth signal, for comparing the voltage level of the sawtooth signal with a first voltage slightly above the minimum voltage level and with a second voltage slightly below the maximum voltage level, and for generating a square wave with a rising edge that occurs when voltage of the sawtooth signal is increasing and reaches the first voltage and with a falling edge that occurs when the voltage of the sawtooth signal is increasing and reaches the second voltage, wherein the square wave signal generating means includes:

a first voltage source for generating the first voltage;

a second voltage source for generating the second voltage;

a switch, coupled to the first voltage source and the second voltage source, for selecting, based on a voltage of the square wave, one of the first voltage and the second voltage to place on a switch output;

a comparator, coupled to the switch output and to the sawtooth signal generating means, for comparing voltage of the sawtooth signal with voltage at the switch output to produce a comparator output;

a one shot pulse generator means, coupled to the comparator, for generating a pulse at a rising edge of the comparator output; and flip-flop means, coupled to the one shot pulse generator means, for toggling voltage of the square wave signal upon receiving a pulse from the one shot pulse generating means.

3. A circuit as in claim 2 wherein the first voltage source and the second voltage source comprise a voltage divider, a first end of the voltage divider being at the minimum voltage level, a second end of the voltage divider being at the maximum voltage level, and the voltage divider including a first resistance, a second resistance and a third resistance coupled in series so that a first end of the first resistance is the first end of the voltage divider and a first end of the third resistance is the second end of the voltage divider, wherein the values of the first, second and third resistances are selected so that a second end of the first resistance is at the second voltage and a second end of the third resistance is at the first voltage.

4. A circuit which generates control signals used in pulse width modulation, the control signals including a square wave signal and a sawtooth signal, the sawtooth signal having a maximum voltage level and a minimum voltage level, the circuit comprising:

sawtooth signal generating means, for generating the sawtooth signal; and, square wave signal generating means, coupled to the sawtooth signal generating means, for receiving the sawtooth signal, for comparing the voltage level of the sawtooth signal with a first voltage slightly above the minimum voltage level and with a second voltage slightly below the maximum voltage level, and for generating a square wave with a rising edge that occurs when voltage of the sawtooth signal is increasing and reaches the first voltage and with a falling edge that occurs when voltage of the sawtooth signal is increasing and reaches the second voltage, wherein the square wave signal generating means includes:

a first voltage source for generating the first voltage;

a second voltage source for generating the second voltage;

a first comparator, coupled to the first voltage source and to the sawtooth signal generating means, for comparing voltage of the sawtooth signal with the first voltage to produce a first comparator output;

a second comparator, coupled to the second voltage source and to the sawtooth signal generating means, for comparing voltage of the sawtooth signal with the second voltage to produce a second comparator output;

first one shot pulse generator means, coupled to the first comparator, for generating a pulse at a rising edge of the first comparator output; and second one shot pulse generator means, coupled to the second comparator, for generating a pulse at a rising edge of the second comparator output; and flip-flop means, coupled to the first one shot pulse generator means and to the second one shot pulse generator means, for toggling voltage of the square wave signal upon receiving a pulse from the first one shot pulse generating means and for toggling voltage of the square wave signal upon receiving a pulse from the second one shot pulse generating means.

5. A circuit as in claim 4 wherein the first voltage source and the second voltage source comprise a voltage divider, a first end of the voltage divider being at the maximum voltage level, a second end of the voltage divider being at the minimum voltage level, and the voltage divider including a first resistance, a second resistance and a third resistance coupled in series so that a first end of the first resistance is the first end of the voltage divider and a first end of the third resistance is the second end of the voltage divider, wherein the values of the first, second and third resistances are selected so that a second end of the first resistance is at the second voltage and a second end of the third resistance is at the first voltage.

6. In a circuit which generates control signals used in pulse width modulation, the control signals including a square wave signal and a sawtooth signal, the sawtooth signal having a maximum voltage level and a minimum voltage level, a method comprising the steps of:

(a) generating the sawtooth signal so that the sawtooth signal oscillates between the maximum voltage level and the minimum voltage level;

(b) comparing voltage level of the sawtooth signal with a first voltage slightly above the minimum voltage level;

(c) generating a rising edge of the square wave only when voltage of the sawtooth signal is increasing and reaches the first voltage;

(d) comparing voltage level of the sawtooth signal with a second voltage slightly below the maximum voltage level; and, (e) generating a falling edge of the square wave signal only when voltage of the sawtooth signal is increasing and reaches the second voltage.

7. A circuit which generates control signals used in pulse width modulation, the control signals including a square wave signal and a sawtooth signal, the sawtoth signal having a first voltage level and a second voltage level, the circuit comprising:

sawtooth signal generating means, for generating the sawtooth signal which oscillates between the first voltage level and the second voltage level; and, square wave signal generating means, coupled to the sawtooth signal generating means, for receiving the sawtooth signal, for comparing the voltage level of the sawtooth signal with a third voltage level between the first voltage level and the second voltage level and with a fourth voltage level between the first voltage level and the third voltage level, and for generating a square wave with a rising edge that occurs only when voltage of the sawtooth signal is oscillating from the second voltage level to the first voltage level and reaches the third voltage level and with a falling edge that occurs only when voltage of the sawtooth signal is oscillating from the second voltage level to the first voltage level and reaches the fourth voltage level.

8. A circuit as in claim 7 wherein the square wave signal generating means includes:

a third voltage level source for generating the third voltage level;

a fourth voltage level source for generating the fourth voltage level;

a switch, coupled to the third voltage level source and the fourth voltage level source, for selecting, based on a voltage of the square wave, one of the third voltage level and the fourth voltage level to place on a switch output;

a comparator, coupled to the switch output and to the sawtooth signal generating means, for comparing voltage of the sawtooth signal with voltage at the switch output to produce a comparator output;

a one shot pulse generator means, coupled to the comparator, for generating a pulse at a rising edge of the comparator output; and, flip-flop means, coupled to the one shot pulse generator means, for toggling voltage of the square wave signal upon receiving a pulse from the one shot pulse generating means.

9. A circuit as in claim 8 wherein the third voltage level source and the fourth voltage level source comprise a voltage divider, a first end of the voltage divider being at the first voltage level, a second end of the voltage divider being at the second voltage level, and the voltage divider including a first resistance, a second resistance and a third resistance coupled in series so that a first end of the first resistance is the first end of the voltage divider and a first end of the third resistance is the second end of the voltage divider, wherein the values of the first, second and third resistances are selected so that a second end of the first resistance is at the fourth voltage level and a second end of the third resistance is at the third voltage level.

10. A circuit as in claim 7 wherein the square wave signal generating means includes:
- a third voltage level source for generating the third voltage level;
- a fourth voltage level source for generating the fourth voltage level;
- a first comparator, coupled to the third voltage level source and to the sawtooth signal generating means, for comparing voltage of the sawtooth signal with the third voltage level to produce a first comparator output;
- a second comparator, coupled to the fourth voltage level source and to the sawtooth signal generating means, for comparing voltage of the sawtooth signal with the fourth voltage level to produce a second comparator output;
- first one shot pulse generator means, coupled to the first comparator, for generating a pulse at a rising edge of the first comparator output; and,
- second one shot pulse generator means, coupled to the second comparator, for generating a pulse at a rising edge of the second comparator output; and
- flip-flop means, coupled to the first one shot pulse generator means and to the second one shot pulse generator means, for toggling voltage of the square wave signal upon receiving a pulse from the first one shot pulse generating means and for toggling voltage of the square wave signal upon receiving a pulse from the second one shot pulse generating means.

11. a circuit as in claim 10 wherein the third voltage level source and the fourth voltage level source comprise a voltage divider, a first end of the voltage divider being at the first voltage level, a second end of the voltage divider being at the second voltage level, and the voltage divider including a first resistance, a second resistance and a third resistance coupled in series so that a first end of the first resistance is the first end of the voltage divider and a first end of the third resistance is the second end of the voltage divider, wherein the values of the first, second and third resistances are selected so that a second end of the first resistance is at the fourth voltage level and a second end of the third resistance is at the third voltage level.

12. A circuit as in claim 7 wherein
- the first voltage level is a maximum voltage level,
- the second voltage level is a minimum voltage level,
- the third voltage level is slightly above the minimum voltage level, and
- the fourth voltage level is slightly below the maximum voltage level.

* * * * *